United States Patent
Hopper

(10) Patent No.: US 7,456,030 B1
(45) Date of Patent: Nov. 25, 2008

(54) ELECTROFORMING TECHNIQUE FOR THE FORMATION OF HIGH FREQUENCY PERFORMANCE FERROMAGNETIC FILMS

(75) Inventor: Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/974,143

(22) Filed: Oct. 11, 2007

(51) Int. Cl.
*H01L 27/01* (2006.01)

(52) U.S. Cl. .................... 438/3; 257/E21.022; 205/119; 205/123; 205/183; 438/381; 438/677; 438/372; 438/692; 438/466

(58) Field of Classification Search .......... 257/E21.022; 438/3, 381, 677, 672, 692, FOR. 220, 466; 205/119, 123, 183

See application file for complete search history.

(56) References Cited

U.S. PATENT DOCUMENTS

| | | | | |
|---|---|---|---|---|
| 6,528,400 B2 * | 3/2003 | Fukada et al. | ............... | 438/584 |
| 6,970,323 B2 * | 11/2005 | Kamijima | .............. | 360/123.39 |
| 7,391,115 B2 * | 6/2008 | Usami et al. | ................. | 257/760 |
| 2002/0008323 A1 * | 1/2002 | Watanabe et al. | ........... | 257/758 |
| 2002/0076921 A1 * | 6/2002 | Fukada et al. | ................ | 438/637 |
| 2005/0024766 A1 * | 2/2005 | Khera et al. | ................. | 360/125 |
| 2005/0045848 A1 * | 3/2005 | Bedell et al. | .................... | 252/2 |
| 2005/0152064 A1 * | 7/2005 | Bedell et al. | ................. | 360/126 |
| 2005/0275497 A1 * | 12/2005 | Ramadan et al. | ............ | 336/200 |
| 2006/0216920 A1 * | 9/2006 | Kojima | ....................... | 438/618 |
| 2007/0026681 A1 * | 2/2007 | Shiraiwa et al. | ............. | 438/709 |
| 2007/0064344 A1 * | 3/2007 | Etoh et al. | ................... | 360/125 |
| 2007/0177301 A1 * | 8/2007 | Han et al. | .................... | 360/126 |
| 2008/0067077 A1 * | 3/2008 | Kodera et al. | .............. | 205/645 |
| 2008/0096389 A1 * | 4/2008 | Feng et al. | ................... | 438/692 |
| 2008/0117552 A1 * | 5/2008 | Zhou et al. | .................. | 360/319 |

* cited by examiner

*Primary Examiner*—George Fourson
(74) *Attorney, Agent, or Firm*—Stallman & Pollock LLP

(57) ABSTRACT

A hybrid method of fabricating magnetic core elements of an on-chip inductor structure addresses issues associated with conventional bottom up and damascene magnetic core plating techniques. The process uses two seed layers: a low resistance seed layer that solves the IR drop problem associated with the damascene plating techniques and a high resistance seed layer that is local to magnetic core features thus avoiding eddy current related performance degradation associated with the bottom up techniques.

6 Claims, 6 Drawing Sheets

ELECTROFORMING TECHNIQUE FOR THE FORMATION OF HIGH FREQUENCY PERFORMANCE FERROMAGNETIC FILMS

FIELD OF THE INVENTION

The present invention relates to semiconductor integrated circuits and, in particular, to an electroforming technique for fabricating high frequency performance ferromagnetic on-chip inductor structures.

DISCUSSION OF THE RELATED ART

Inductors are commonly used in the electronics industry for storing magnetic energy. An inductor is typically created by providing an electric current through a metal conductor, such as a metal plate or bar. The current passing through the metal conductor creates a magnetic field or flux around the conductor.

In the semiconductor industry, it is known to form inductors as part of integrated circuit structures. The inductors are typically created by fabricating what is commonly called an "air coil" inductor around the integrated circuit chip. The air coil inductor is either aluminum or some other metal that is patterned in a helical, toroidal or "watch spring" coil shape. By applying a current through the inductor, the magnetic flux is created.

Inductors are used in integrated circuits for a variety of applications. Perhaps the most common use is in direct current to direct current (DC-DC) switching regulators. In many situations, however, a conventional on-chip inductor does not generate enough flux or energy for a particular application. In these cases, a larger off-chip inductor may be required.

There are a number of well recognized problems associated with the use of off-chip inductors. Foremost, they tend to be expensive. They can also be problematic in applications where space is at a premium, such as in hand-held devices like cell phones and personal digital assistants (PDA).

The issue of providing small, efficient on-chip power inductors, particularly for switching regulator applications, is receiving increasing attention in the integrated circuit industry. For example, co-pending and commonly-assigned U.S. patent application Ser. No. 11/495,143, filed on Jul. 27, 2006, by Peter J. Hopper et al. and titled "Apparatus and Method for Wafer Level Fabrication of High Value Inductors on Semiconductor Integrated Circuits" and U.S. patent application Ser. No. 11/504,972, filed on Aug. 15, 2006, by Peter J. Hopper et al. and titled "Apparatus and Method for Wafer Level Fabrication of High Value Inductors on Semiconductor Integrated Circuits" both disclose techniques for wafer level fabrication of inductor structures directly on top of semiconductor integrated circuits.

Both of the above-cited Hopper et al. applications disclose a so-called "bottom up" approach to electroforming the ferromagnetic core structures utilized in the inductors. With reference to FIGS. 1A-1C, this "bottom up" up approach requires that a low resistance seed layer 102 (e.g., copper) be deposited on a substrate 100 and a patterned mask 104 (e.g., photoresist) be formed (FIG. 1A) over the seed layer 102. The exposed portions of the seed layer 102 are then electroplated using conventional electrochemical deposition (ECD) techniques to provide the desired ferromagnetic structures 106 (FIG. 1B). The mask 104 and the remaining exposed portions of the seed layer 102 are then stripped to form the stand-alone ferromagnetic structures 106 (FIG. 1C).

This bottom up approach requires a lengthy plating time to reach final thickness and exhibits uniformity issues during ECD in the case where narrow aspect ratio features are being plated. If high resistance seed layers are required, specific to a requirement for plating high performance ferromagnetic inductor core elements, so as to avoid parasitic surface eddy currents that are limiting high frequency performance, the uniformity issue is magnified due to enhanced IR drop.

Co-pending and commonly-assigned U.S. patent application Ser. No. 11/973,861 filed on Oct. 10, 2007 by Peter Smeys et al. and titled "Magnetically Enhanced Power Inductor With a Self-Aligned Hard Axis Magnetic Core Produced Using A Damascene Process Sequence," also discloses techniques for wafer level fabrication of on-chip inductor structures. With reference to FIGS. 2A-2C, in these techniques, a so-called "damascene" electroplating process is used to form both the bottom and the top segmented magnetic core elements of the inductor. The damascene process requires that a permanent dielectric mold 202 be formed on a substrate 200 and that a high resistance seed layer 204 (e.g., Ti+Al or Ti+NiFe) be conformally deposited (FIG. 2A) over the exposed surfaces of the mold 202. A ferromagnetic layer 206 (e.g., permalloy) is then formed using ECD techniques (FIG. 2B). The ferromagnetic layer 206 is planarized in a chemical mechanical polishing (CMP) step to define the ferromagnetic core elements 208 (FIG. 2C). The exposed portions of the seed layer 204 are then stripped.

In the case of thick films, the damascene process requires a considerable CMP polishing time after ECD.

It would, thus, be highly desirable to have available techniques for fabricating high performance ferromagnetic inductor core structures and a low cost technique for the formation of conducting interconnects needed for the electroplating process.

Application Ser. No. 11/495,143, application Ser. No. 11/504,972 and application Ser. No. 11/115,632 are hereby incorporated by reference herein in their entirety to provide background information regarding the present invention.

SUMMARY OF THE INVENTION

The present invention provides a hybrid method of fabricating magnetic core elements of an on-chip inductor structure. The hybrid method addresses issues associated with previous "bottom up" and damascene magnetic core element electroplating techniques. The process uses two seed layers: a low resistance seed layer that provides the electroplating interconnects and that solves the IR drop problem associated with the damascene technique and a high resistance seed layer that is local to the magnetic core features thus avoiding eddy current related performance degradation associated with the bottom up technique.

The method of the invention provides high frequency device performance, cost and processing time advantages when compared with the conventional damascene and bottom up plating approaches.

The features and advantages of the various aspects of the present invention will be more fully understood and appreciated upon consideration of the following detailed description of the invention and the accompanying drawings, which set forth an illustrative embodiment in which the concepts of the invention are utilized.

DETAILED DESCRIPTION OF THE INVENTION

The present invention is described below in the context of a particular integrated circuit die configuration. Those skilled in the art should appreciate that this particular disclosed embodiment of the invention is intended to be an example and not limiting of the scope of the invention.

Figure 1A:
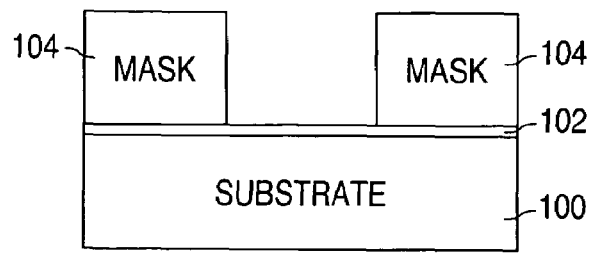
FIGS. 1A-1C are partial cross section drawings illustrating a sequence of process steps for forming ferromagnetic structures using a "bottom up" electroforming technique.
Figure 1B:
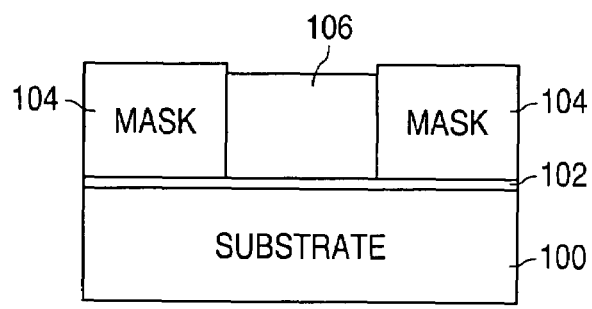
Figure 1C:
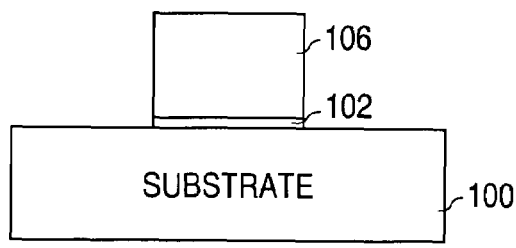
Figure 2A:
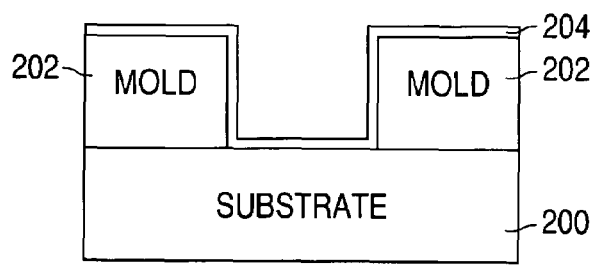
FIGS. 2A-2C are partial cross section drawings illustrating a sequence of steps for forming ferromagnetic structures using a damascene electroforming technique.
Figure 2B:
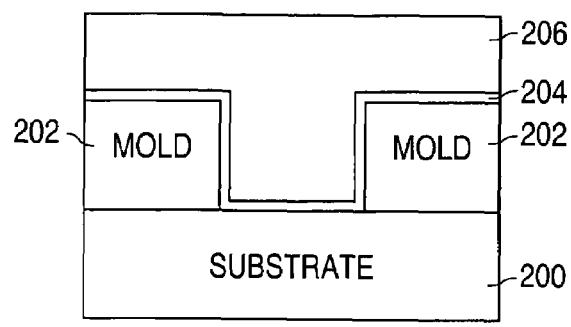
Figure 2C:
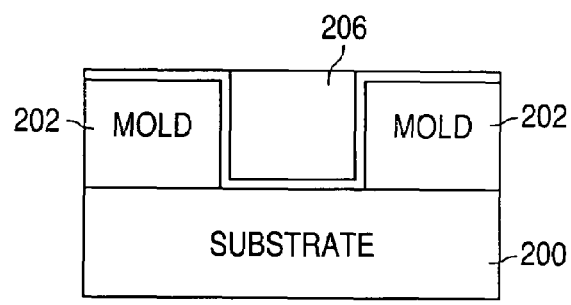
Figure 3:
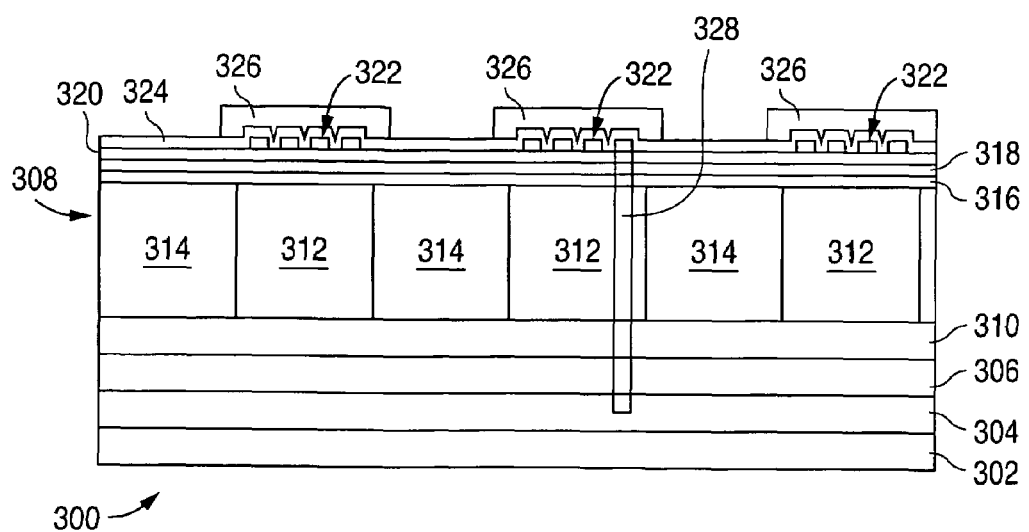
FIG. 3 is a partial cross section drawing illustrating a semiconductor integrated circuit die with both power circuitry and an inductor structure fabricated thereon.

FIG. 3 shows a cross section of an integrated circuit die 300 with an integrated circuit (e.g., a DC-DC switching regulator) and an inductor structure fabricated directly thereon. The die 300 includes a silicon substrate 302 with the integrated circuit fabricated thereon in accordance with well known semiconductor manufacturing techniques (for the sake of simplicity, complete details of the integrated circuit are not shown in FIG. 3). The die 300 also includes a metal interconnect structure 304, including one or more levels of metal interconnect, and an upper dielectric layer 306 (e.g., a die passivation layer) formed over the metal interconnect structure 304. An inductor structure 308 is fabricated directly on a plating layer 310 that is formed over the dielectric layer 306. The inductor 308 includes a plurality of magnetic core inductor segments 312 formed between dielectric spacers 314, a planarization surface 316 formed over the inductor segments 312 and spacers 314, an insulating layer 318, another plating layer 320, a conductive inductor coil 322, a protective layer 324 formed over the inductor coil 322, and a top segmented magnetic core structure 326 formed over the protective layer 324. An electrical contact 328 is provided between the inductor coil 322 and a switching node (not shown) provided on one of the metal layers of the interconnect structure 304.

Figure 4:
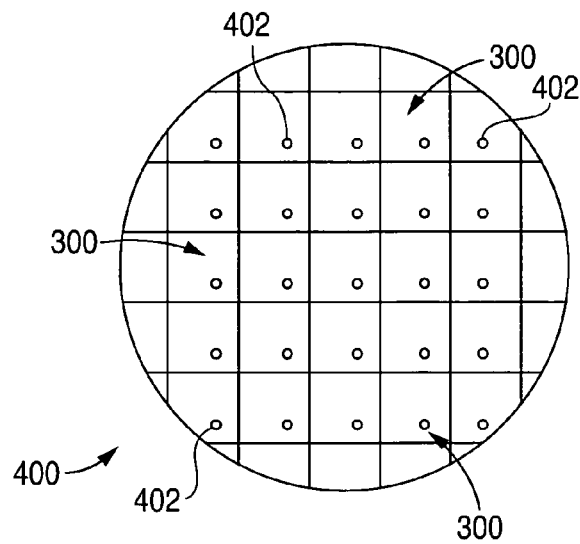
FIG. 4 is a top view illustrating a semiconductor wafer that includes a plurality of integrated circuit die with each die having power circuitry fabricated thereon.

FIG. 4 shows a semiconductor wafer 400 that includes a plurality of the individual integrated circuit die 300 described above in conjunction with FIG. 3. Each die 300 includes, for example, power regulation circuitry formed thereon, including a switching node 402 (for sake of simplicity, the power regulation circuitry is not shown in FIG. 4). As mentioned above, the switching node 402 is typically in electrical contact with one of the metal layers of the interconnect structure 304. The switching node 402 is also in electrical contact with the underlying transistors that form the power regulation circuitry of the die 300.

Figure 5A:
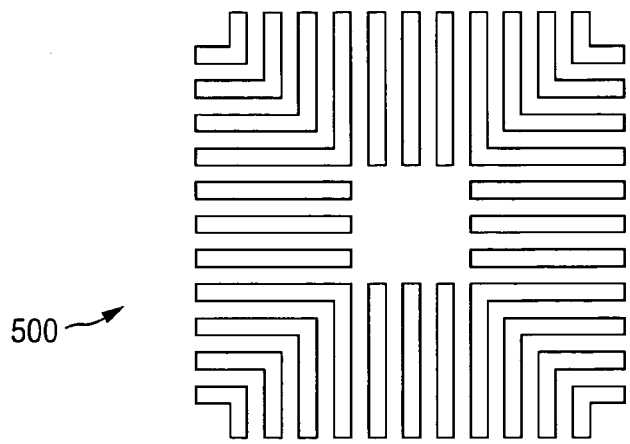
FIGS. 5A-5C are top views illustrating the top segmented magnetic plate, the conductive inductor coil and the bottom segmented magnetic plate, respectively, of an inductor structure fabricated in accordance with the concepts of the present invention.
Figure 5B:
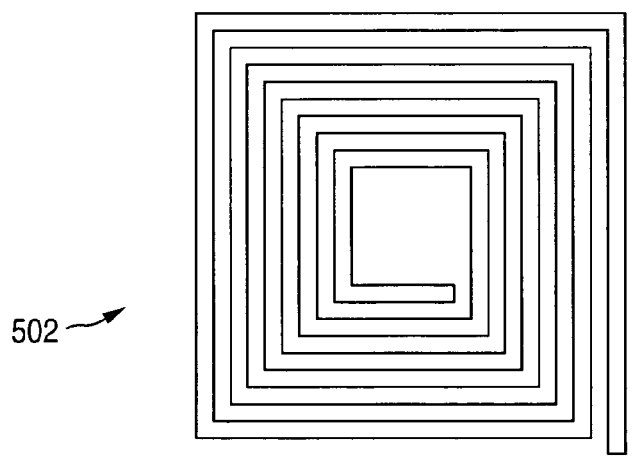
Figure 5C:
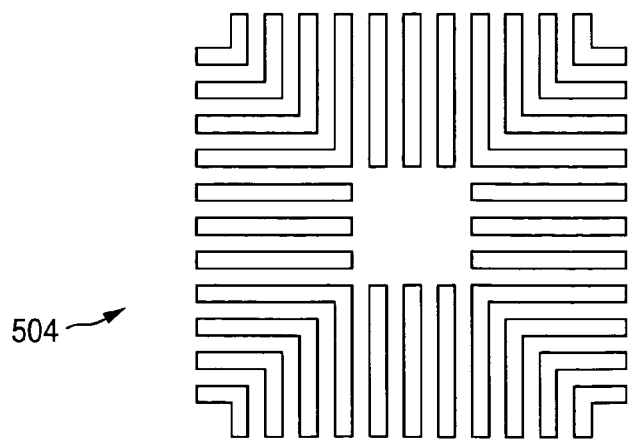

As discussed above, the on-chip inductor structure 308 includes two segmented magnetic core elements that surround an insulated conductive inductor coil. FIG. 5A shows an embodiment of a segmented bottom magnetic core element 500; FIG. 5B shows an embodiment of a conductive (e.g., copper) inductor coil 502; FIG. 5C shows an embodiment of a segmented top magnetic core element 504. Those skilled in the art will appreciate that the embodiments shown in FIGS. 3A-3C are examples and that other embodiments of the bottom magnetic core element, the inductor coil and the top magnetic core element may be utilized. For example, FIGS. 5A and 5C show the bottom and top magnetic core elements to be identical; those skilled in the art will appreciate that this need not necessarily be the case.

Figure 6A:
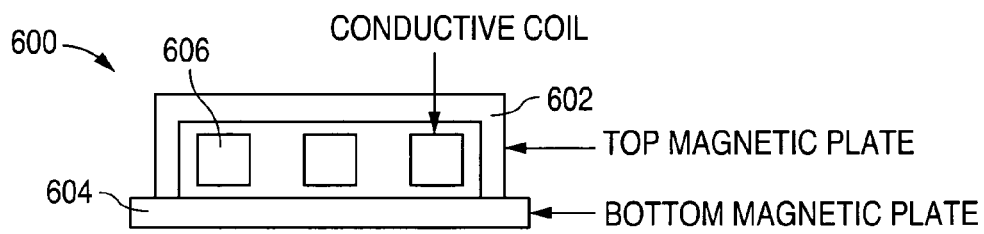
FIGS. 6A and 6B are cross section views illustrating two respective embodiments of an inductor structure fabricated in accordance with the concepts of the present invention.
Figure 6B:
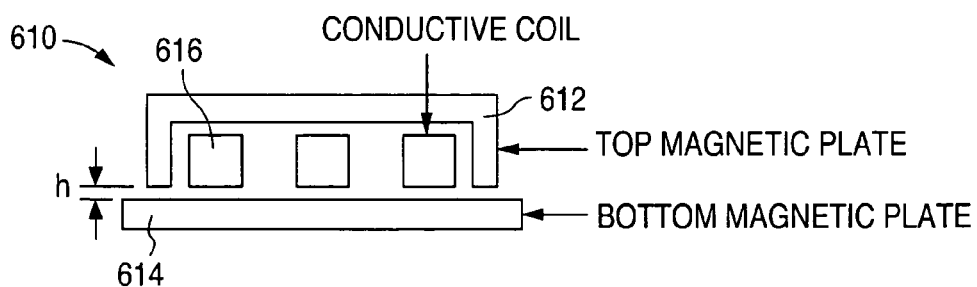

FIGS. 6A and 6B show cross section views of two inductor structures 600 and 610, respectively, that are compatible with the concepts of the invention. In the FIG. 6A structure 600, the segmented top magnetic core element 602 and the segmented bottom magnetic core element 604 surround the inductor coil 606 and touch each other; large inductance can be made by this configuration because reluctance is minimized. In the FIG. 6B inductor structure 410, there is a finite gap (h) between the segmented top magnetic core element 612 and the segmented bottom magnetic core element 614 that surround the inductor coil 616. The magnetic inductance can be adjusted by changing the height of the gap h. Also, magnetic saturation due to high current level can be controlled by the gap height h. In both the FIG. 6A structure and the FIG. 6B structure, the coil is electrically insulated from the top and bottom magnetic core elements by intervening dielectric material.

As discussed in detail below, the present invention provides a hybrid fabrication method for the magnetic core elements of an on-chip inductor structure that addresses issues associated with the "bottom up" and "damascene" techniques. The hybrid method utilizes a combination of two seed layers without the use of an additional mask, thereby allowing the use of both a low resistance seed layer to solve the IR drop related non-uniformity issue, while at the same time using a high resistance seed layer that is local to the elements of the magnetic core structure, thereby avoiding eddy current related performance degradation. Those skilled in the art will appreciate that the process of the present invention may be utilized for the fabrication of one or the other or both of the magnetic core elements of an on-chip inductor structure. An embodiment of a process flow in accordance with the concepts of the present invention is described below in conjunction with FIGS. 7A-7G.

Figure 7A:
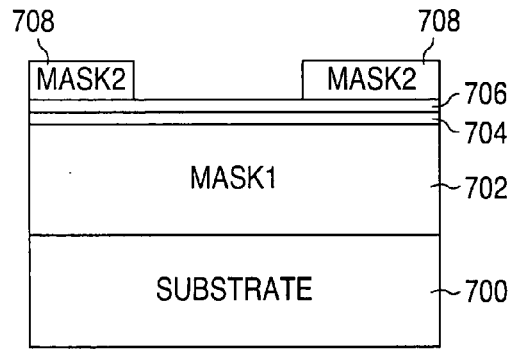
FIGS. 7A-7G are partial cross section drawing illustrating a sequence of processing steps for fabricating top and bottom segmented magnetic core elements for an inductor structure in accordance with the concepts of the present invention

FIG. 7A shows the formation of a first layer of dielectric mold material (e.g., SU8, a well known photo image epoxy) 702 on an underlying substrate 700. This step is followed by formation of a low resistance seed layer 704 on the mold material 702. The low resistance seed layer 704 preferably comprises copper, such as, for example a Ti—Cu—Ti or Ti—Cu stack, the copper serving to lower the resistance across the wafer, as one sinks perhaps 5-10 amps across the wafer during the plating operation. An oxide/nitride hard mask layer 706 is then deposited on the low resistance seed layer 704. A second dielectric mask 708 (e.g., photoresist) is formed then formed on the hard mask layer 706 and patterned in accordance with convention techniques to expose an upper surface portion of the hard mask layer 706.

Figure 7B:
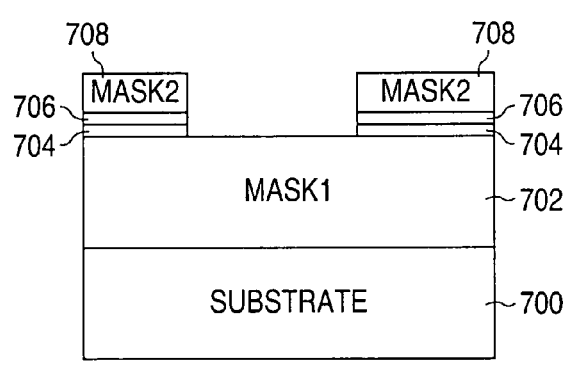
Figure 7C:
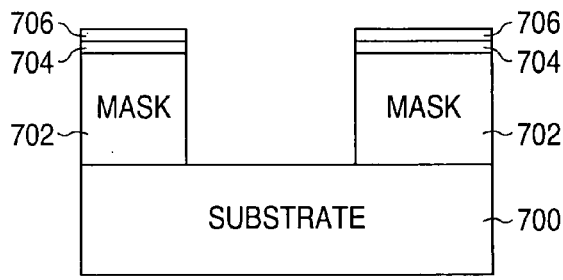

The patterned second dielectric mask 708 is then utilized to etch the exposed portion of the hard mask layer 706 and the underlying low resistance seed layer 704 to expose an upper surface portion of the mold material 702, as shown in FIG. 7B. The second mask 708 is then removed and an oxygen RIE etch step is performed to remove exposed portions of the mold layer 702 to expose an upper surface region of the substrate 700, as shown in FIG. 7C.

Figure 7D:
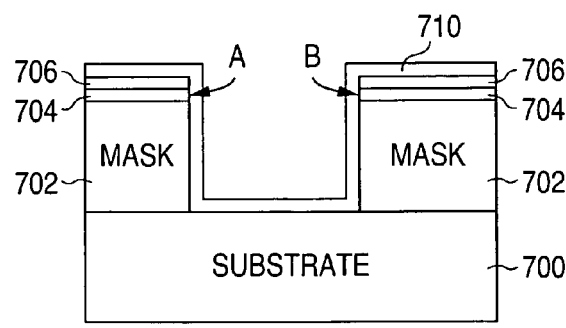

Referring to FIG. 7D, a high resistance seed layer 710 is then conformally deposited by physical vapor deposition to cover the exposed surface region of the substrate 700, exposed sidewalls of the mold layer 702, and exposed regions of the low resistance seed layer 704 and hard mask layer 706. Notably, the high resistance seed layer 710 is formed to be in electrical contact with the low resistance seed layer 702 (at points A and B in FIG. 7D) in order to facilitate the subsequent electroplating process.

The resistance of the higher resistance of this local seed layer 710 is greatly beneficial for the lamination so the ferromagnetic material in terms of eddy current losses during inductor operation. The seed layer 710 can comprise any thin ferromagnetic, high resistance film such as Fe, Ni, Co, Zr, Ta and combinations and compounds thereof (e.g. Ti+Al and NiFe).

Figure 7E:
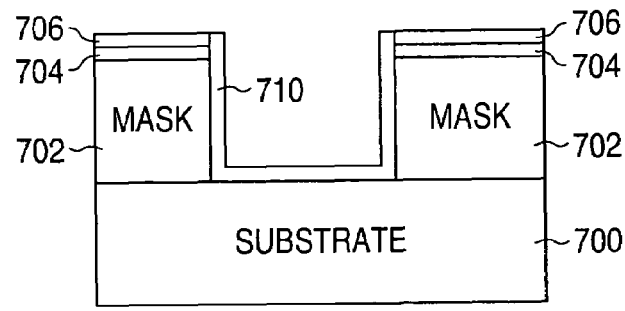

A chemical mechanical polishing (CMP) step is then performed to remove those portions of the high resistance seed layer 710 that are formed on the upper surface of the oxide/nitride hard mask 706. The CMP step stops on the hard mask 706, resulting in the structure shown in FIG. 7E. Thus, as shown in FIG. 7E, the patterned mold layer 702 provides a permanent mold for the formation of a segmented magnetic core element, e.g. the bottom magnetic core element, of the inductor structure. In this disclosed embodiment of the invention, the features of the patterned mold 706 are about 25-35 μm high and less than 10 μm wide; the space between the mold features is less than 10 μm.

Figure 7F:
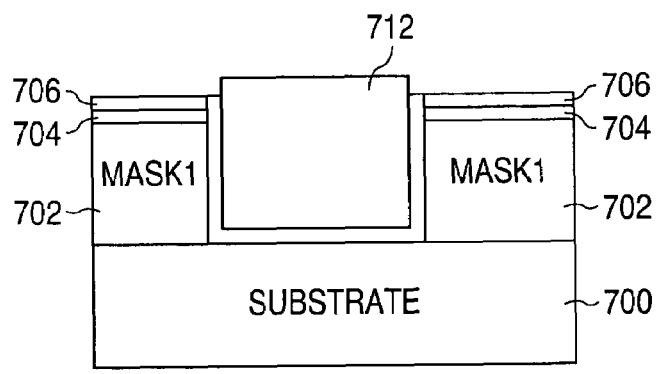

As shown in FIG. 7F, an electroplating step is then performed, utilizing the low resistance seed layer 704, to electroplate a ferromagnetic layer 712, such as, for example, pernalloy (80% Ni+20% Fe) or an alternative magnetic core material, in accordance with well known electroplating techniques. The electroplated ferromagnetic material 712 needs to be about 5 μm thick in order to fill the gap between the features of the mold (Mask1) 702. Those skilled in the art will appreciate that the easy axis of the ferromagnetic material 712 will be in the direction of the film growth and normal to the surfaces of the Mask1 mold 702. Those skilled in the art will also appreciate that the easy axis can be enhanced by carrying out the electroplating process in an applied magnetic field parallel to the easy axis. The hard axis of the ferromagnetic material 712 will be parallel and self-aligned to the magnetic field produced by the coils of the inductor structure.

Figure 7G:
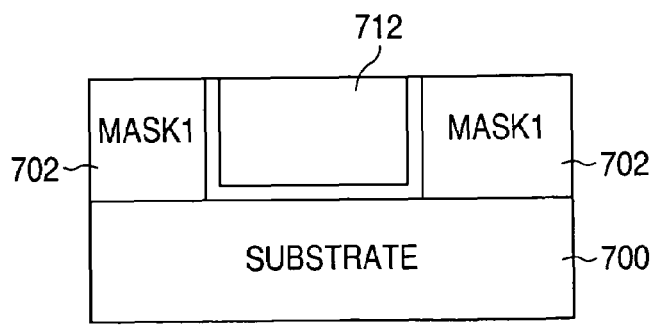

Referring to FIG. 7G, a minimal CMP step is then performed to planarize the ferromagnetic core element 712 and strip the oxide/nitride hard mask 706 and to remove the low resistance seed layer 704, resulting in the formation of, for example, the segmented bottom core element of the on-chip inductor structure.

Those skilled in the art will appreciate that the on-chip inductor structure can be completed by forming a layer of dielectric material over the segmented bottom core element, forming a conductive coil over the dielectric layer, forming a second layer of dielectric material over the inductor coil, all in accordance with well known techniques, and then forming a segmented top magnetic core element on the second dielectric layer in accordance with the steps discussed above in conjunction with FIGS. 7A-7G.

It should be understood that the particular embodiments of the invention described above have been provided by way of example and that other modifications may occur to those skilled in the art without departing from the scope and spirit of the invention as express in the appended claims and their equivalents.

What is claimed is:

1. A method of forming a magnetic structure, the method comprising:
    forming a dielectric mold layer on an underlying substrate;
    forming a low resistance seed layer on the mold layer;
    forming a hard mask layer on the low resistance seed layer;
    forming a patterned dielectric mask layer on the hard mask layer to expose an upper surface region of the hard mask layer;
    utilizing the patterned dielectric mask layer to etch the exposed upper surface region of the hard mask layer and the underlying low resistance seed layer to expose an upper surface region of the mold layer;
    etching expose upper surface region of the mold layer to define at least one mold layer trench having a bottom surface and sidewall surfaces and exposed portions of the low resistance seed layer and the hard mask layer;
    forming a conformal high resistance seed layer over the bottom and sidewall surfaces of the mold layer trench and over the exposed portions of the low resistance seed layer and the hard mask layer such that the high resistance seed layer is in electrical contact with the low resistance seed layer;
    utilizing the low resistance seed layer and the high resistance seed layer to electroplate magnetic material in the mold layer trench.

2. A method as in claim 1, and wherein the electroplated magnetic material defines low resistance seed layer material and hard mask material on an upper surface of the mold layer, the method further comprising:
    performing a planarizing step to remove the low resistance seed layer material and the hard mask material from the upper surface of the mold layer and to planarize an upper surface of the electroplated magnetic material with the upper surface of mold layer.

3. A method as in claim 2, and wherein the planarizing step comprises chemical mechanical polishing.

4. A method as in claim 1, and wherein the low resistance seed layer comprises copper.

5. A method as in claim 1, and wherein the high resistance seed layer is a selected from Ti+Al and Ti+NiFe.

6. A method as in claim 1, and wherein the high resistance seed layer is a ferromagnetic material selected from the group consisting of Fe, Ni, Co, Zr, Ta, combinations thereof, and compounds thereof.

* * * * *